United States Patent
Myatt et al.

(10) Patent No.: US 7,947,149 B2
(45) Date of Patent: May 24, 2011

(54) LAMINATION PROCESS AND ROLLER FOR USE THEREIN

(75) Inventors: Arthur Myatt, Pleasant Ridge, MI (US); Gregory Demaggio, Ann Arbor, MI (US); Kevin Beernink, Clarkston, MI (US); Kermit Jones, Rochester, MI (US); Kenneth Lord, Rochester Hills, MI (US)

(73) Assignee: United Solar Ovonic LLC, Auburn Hills, MI (US)

( * ) Notice: Subject to any disclaimer, the term of this patent is extended or adjusted under 35 U.S.C. 154(b) by 623 days.

(21) Appl. No.: 12/017,180

(22) Filed: Jan. 21, 2008

(65) Prior Publication Data

US 2008/0179001 A1 Jul. 31, 2008

Related U.S. Application Data

(60) Provisional application No. 60/886,517, filed on Jan. 25, 2007.

(51) Int. Cl.
*B32B 37/08* (2006.01)

(52) U.S. Cl. ..... 156/324; 156/580; 242/571; 242/571.3; 242/571.4; 242/571.5; 242/571.6; 242/530; 242/920; 474/161; 474/162; 474/163; 474/190; 474/191; 474/192; 492/36; 492/38; 492/46; 492/30; 492/28

(58) Field of Classification Search ............... 242/571, 242/571.3, 571.4, 571.5, 571.6, 530, 920; 474/161–163, 190–192; 492/36, 38, 46, 30, 28; 156/324, 580

See application file for complete search history.

(56) References Cited

U.S. PATENT DOCUMENTS

| | | | |
|---|---|---|---|
| 3,544,016 A | * | 12/1970 | Rushton et al. ............ 242/571.6 |
| 4,625,376 A | | 12/1986 | Schiel et al. |
| 5,103,284 A | | 4/1992 | Ovshinsky et al. |
| 5,257,965 A | | 11/1993 | Fuchs et al. |
| 5,273,608 A | * | 12/1993 | Nath .............................. 156/301 |
| 5,906,567 A | | 5/1999 | Gautier et al. |
| 6,087,580 A | | 7/2000 | Ovshinsky et al. |
| 6,723,421 B2 | | 4/2004 | Ovshinsky et al. |
| 7,176,543 B2 | | 2/2007 | Beernink |
| 7,199,303 B2 | | 4/2007 | Machida et al. |
| 2004/0035487 A1 | | 2/2004 | Trivelli |

FOREIGN PATENT DOCUMENTS

GB 2386366 A * 9/2003

* cited by examiner

*Primary Examiner* — Jeff H Aftergut
*Assistant Examiner* — Jaeyun Lee
(74) *Attorney, Agent, or Firm* — Gifford, Krass, Sprinkle, Anderson & Citkowski, P.C.

(57) ABSTRACT

A web of a first sheet material and a web of a second sheet material are laminated together by a process wherein the sheet materials are wound, in an interleaved relationship, upon a roller having a radially displaceable outer surface. The roller and webs and then subjected to heating and/or a low-pressure environment so as to complete the lamination. A body of adhesive material, such as a hot melt adhesive, may be interposed between the webs and the heating or low pressure environment can activate this adhesive. Further disposed are particular configurations of rollers with radially displaceable surfaces.

12 Claims, 3 Drawing Sheets

LAMINATION PROCESS AND ROLLER FOR USE THEREIN

CROSS REFERENCE TO RELATED APPLICATIONS

This application claims priority of U.S. Provisional Patent Application Ser. No. 60/886,517 filed Jan. 25, 2007, entitled "Lamination Process and Roller for Use Therein."

GOVERNMENT INTEREST

This invention was made, at least in part, under U.S. Government Contract No. AFRL#F29601-03-C-0122. The Government may have rights in this invention.

FIELD OF THE INVENTION

This invention relates generally to lamination processes, and more specifically to processes for laminating lengthy webs of thin, flexible materials. In another aspect, the invention relates to a particular, radially compressible roller which may be utilized in the lamination process.

BACKGROUND OF THE INVENTION

Thin film optical and electronic devices including, but not limited to, photovoltaic devices, electrical circuits, displays, optical filters and the like, are often disposed upon thin, flexible substrates in order to decrease the device weight and/or provide a flexible device. These substrates may comprise metallic sheets or polymeric bodies, and in particular instances, such polymers may comprise polyimides.

Use of a thin substrate body can complicate fabrication of the device, particularly if high speed, high volume processes, such as roll-to-roll deposition processes, are utilized. In such instances, the thin, flexible substrate is frequently supported upon a body of carrier material, such as a sheet of metal or polymer. Following the device fabrication, the carrier is removed by physical and/or chemical methods. In one particular example, a thin, polymeric substrate comprised of a polyimide is supported upon a carrier comprising a sheet of ferrous alloy such as stainless steel. Following device fabrication, the stainless steel is removed by etching. One such process is disclosed in U.S. Pat. No. 7,176,543, the disclosure of which is incorporated herein by reference.

In a process of the type described above, it is necessary to affix the thin, flexible substrate to the carrier member so as to provide a smooth, uniform surface for deposition of the thin film layers. Such affixation is typically accomplished by lamination using a combination of heat and pressure, and optionally a hot or other thermally activated melt adhesive to bond the substrate to the carrier. The lamination process may be readily implemented for relatively small area substrates; however, when large area substrates, such as relatively long webs of materials are being prepared, problems of uniformity can arise. Typically, the lamination process is carried out under low pressure so as to avoid the formation of any bubbles or inclusions which could compromise the laminated surface. One approach to laminating long webs of material involves rolling the webs, in an interleaved configuration, onto a cylindrical support, under tension, and then disposing the rolled material in a low-pressure environment and heating the material to cause the lamination.

Lamination of the substrate materials is typically carried out at fairly high temperatures and these temperatures can cause problems in the lamination process, since the high temperatures can cause deformation or other adverse effects on the roller upon which the webs are wound. Such deformation can result in unevenness, buckling, wrinkling or other defects in the laminated product. In some instances, rollers are provided with an elastomeric surface which can operate to maintain tension in the wound webs and thus accommodate thermal stresses; however, because of problems such as outgassing, thermal degradation or the like, such elastomeric materials cannot be utilized in high temperature ranges typically employed for laminating substrates of this type. Ceramic rollers or various metal alloy rollers can tolerate high temperatures; however, thermal expansion of such rollers is nonuniform, and in general they tend to expand to a greater degree in their center ("barrel") when heated, thereby compressing the webs in a nonuniform manner. The present invention, as will be explained in detail hereinbelow, has been developed to overcome these shortcomings of the prior art and to provide a lamination process and system which is operative to uniformly laminate long webs of materials under relatively high temperature conditions so as to produce laminated materials having sufficiently high quality to allow their use as substrates for the preparation of thin film electronic and optical devices.

BRIEF DESCRIPTION OF THE INVENTION

Disclosed herein is a method for laminating elongated webs of sheet material. According to the method, a first elongated sheet of material and a second elongated sheet of material are rolled, in an interleaved relationship, onto a roller which has a radially displaceable outer surface. The roller, with the interleaved webs wound thereupon, is then heated and/or exposed to a low-pressure environment so as to effectuate the lamination of the webs. In some instances, one of the webs may have a layer of hot melt adhesive disposed on a surface thereof; in other instances, a separate layer of hot melt adhesive may be interleaved between the first and second webs. This hot melt adhesive will function to laminate the webs together. The radially displaceable surface of the roller functions to keep the webs under an appropriate degree of tension during the time they are subjected to the lamination process. In this regard, the webs may be wound onto the roller so as to initially displace and compress the surface of the roller so as to provide a biasing force on the webs. Alternatively, the expansion of the roller during heating will displace the roller surface thereby imposing a biasing force on the webs.

In some instances, the webs comprise a layer of a polymeric material and a layer of a metal. The method may be used to prepare laminated materials having utility as substrates for electronic devices such as photovoltaic devices.

In particular aspects of the invention, the roller may comprise a plurality of leaf springs supported on an outer surface of a core member. In particular aspects, the outer surface of the core member is a cylindrical surface, and the leaf springs may be comprised of a plurality of members each having a length dimension which is disposed so as to be aligned with a length dimension of the cylindrical core, and a width dimension which is aligned with a circumference of the cylindrical surface of the core.

DETAILED DESCRIPTION OF THE INVENTION

The present invention is directed to a method for laminating relatively long webs of flexible material, and to a particular type of roller which may be used in the lamination process. In accord with the method of the present invention, a first and a second elongated web of sheet material are wound, in an interleaved fashion, upon a roller having a radially displaceable surface so as to compress the radially displaceable surface. In this manner, the radially displaceable surface exerts an outward, radial, bias on the webs thus maintaining them under uniform compression. The web and roller are then heated to bring about a thermal lamination process. In particular instances, the rolled webs are subjected to a subatmospheric pressure environment before and/or during at least part of the time they are being heated. By "radially displaceable" is meant that at least some portions of the outer surface of the roller are capable of motion having a component which is directed along a radius of the roller so as to effectively change the diameter of the roller.

Figure 1:
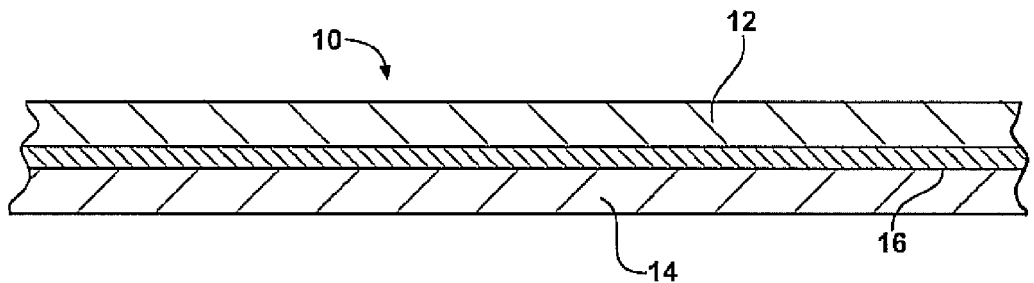
FIG. 1 is a cross-sectional view of a laminated substrate of the type which may be prepared through the use of the present invention.

Referring now to FIG. 1, there is shown a portion of a supported substrate laminated in accord with the present invention. The supported substrate 10 of FIG. 1 includes a body of substrate material 12, a support member 14, and a body of adhesive, such as a hot melt adhesive, a thermosetting adhesive or a pressure-sensitive adhesive 16 therebetween. It is to be understood that in some instances, the carrier 14 and/or substrate 12 may include further layers thereupon. For example, the carrier 14 may include a stress-balancing layer thereupon which layer is subsequently transferred to the substrate 12 when the carrier is removed. As will be described below, an etch-stop layer may also be disposed on the support, and this layer will function to limit the effects of an etchant material which is subsequently used to remove the support from the substrate following lamination. In other instances, the substrate 12 itself may include further layers thereupon. FIG. 1 shows an adhesive 16 as being used to bond the substrate 12 and carrier 14; however, it is to be understood that in some instances, the adhesive may be eliminated and bonding may be accomplished solely by heat and/or pressure. It should also be noted that while FIG. 1 shows the substrate 12 and carrier 14 as being approximately equal in thickness, the relative thicknesses of these two members may vary.

Figure 2:
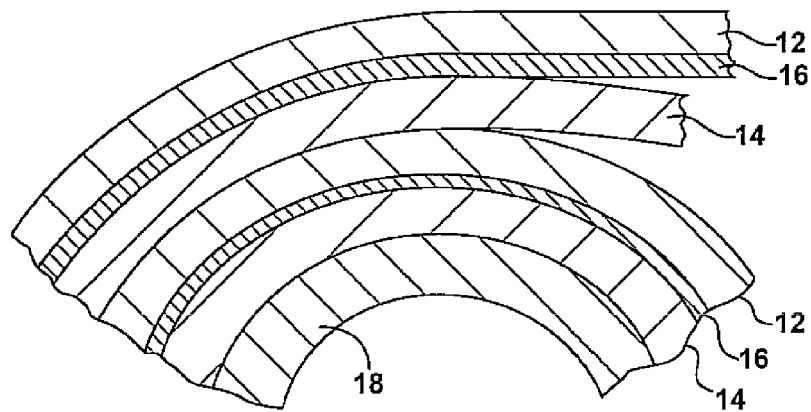
FIG. 2 is an illustration of a first step in a process for the preparation of a body of laminated material wherein there is shown a partial cross-sectional view of a roller having webs of material wound thereonto.

Referring now to FIG. 2, there is shown a first step in a process for the lamination of a web of substrate material 12 onto a carrier 14. Specifically, FIG. 2 shows a portion of a roller 18, having a radially displaceable surface, with a web of substrate material 12 and a web of carrier material 14 being wound thereupon. As will be seen, portions of the webs of these materials have already been wound onto the roller 18. As shown in FIG. 2, the web of substrate material 12 has a layer of an adhesive 16 disposed thereupon. In other instances, the adhesive 16 may be disposed upon the carrier 14, or it may comprise a separate web. And as previously noted, in certain instances, the adhesive may be eliminated.

Figure 4:
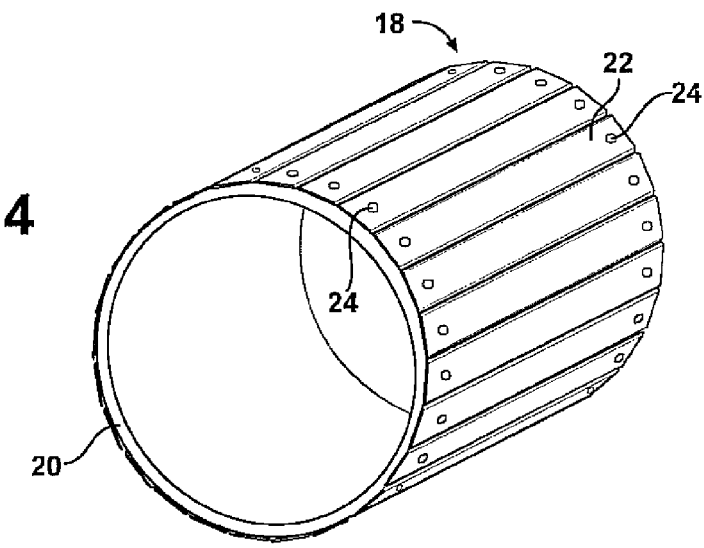
FIG. 4 is a perspective view of the roller of FIG. 3.
Figure 3:
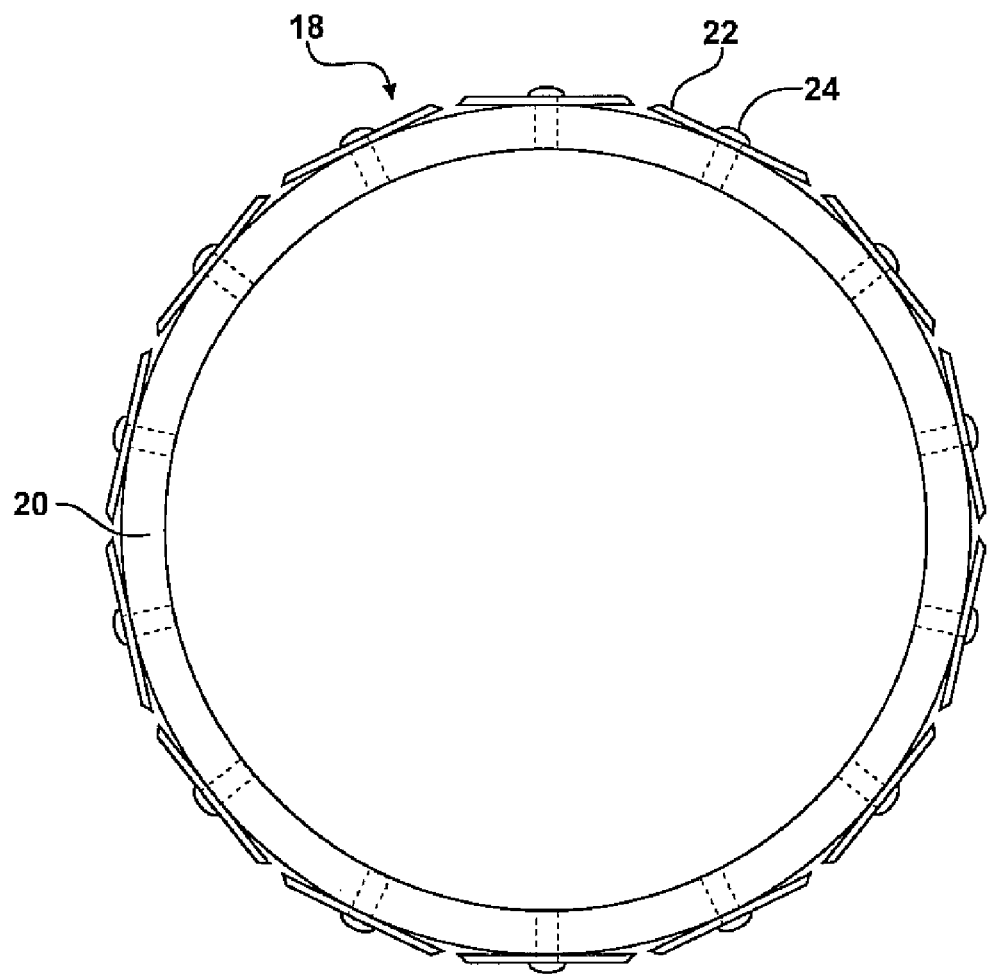
FIG. 3 is a side elevation view of one embodiment of roller which may be used in the practice of the present invention.

Referring now to FIG. 3, there is shown an end view of a roller 18 having a radially displaceable surface. This is one type of roller which may be used in the practice of the present invention. FIG. 4 is a perspective view of this same roller. As will be seen in FIGS. 3 and 4, the roller 18 includes a generally cylindrical core 20 having a plurality of leaf springs, for example spring 22, affixed thereto, in this instance by screws 24. As will be seen in the figures, the leaf springs 22 are disposed about the outer surface of the cylindrical core 20 and are generally aligned with the length dimension of the surface of the cylindrical core. These leaf spring members provide an outer surface for the roller which surface is, in part, displaceable in a direction corresponding generally to the radius of the roller.

Figure 5:
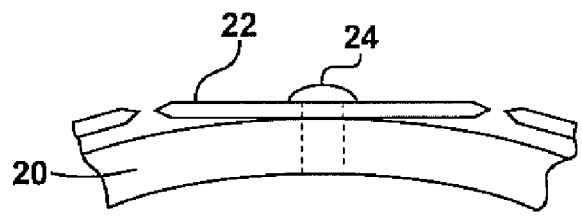
FIG. 5 is an enlarged view of a portion of the roller of FIGS. 3 and 4.
Figure 6:
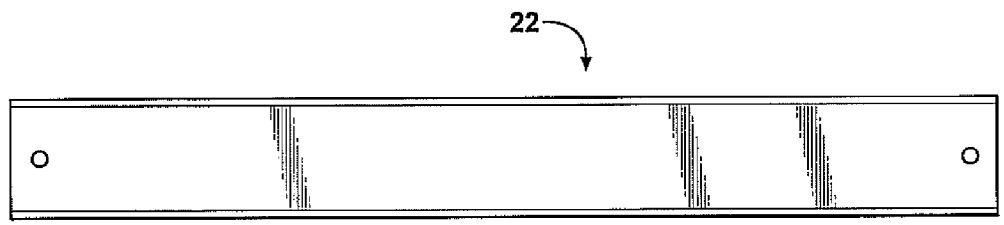
FIG. 6 is a top plan view of one leaf spring member which may be utilized in the roller of FIGS. 3-5.

Referring now to FIG. 5, there is shown an enlarged view of a portion of the roller as it corresponds to the depiction in FIG. 3. As is seen in FIG. 5, a leaf spring member 22 is affixed to the surface of the core 20 by a screw 24. As shown in FIG. 5, the leaf spring 22 is a generally elongated, planar member disposed tangent to the cylindrical surface of the core 20 so that the two edges of the leaf spring 22 are spaced from the surface of the roller. The leaf spring is resilient and hence the free edge portions may be elastically deformed in a path of motion with at least one component which is generally perpendicular to the surface of the roller, and in the context of this disclosure such deformation is referred to as a radial deformation. As shown in FIG. 5, edges of the spring 22 are generally tapered. This feature is not necessary for the practice of the present invention, but does allow for a smoother winding of a web of material thereonto. As shown in FIG. 5, the edges on both sides of the spring 22 are tapered. This dual tapering is not necessary for smooth winding; single tapering will suffice. However by making both sides tapered, the spring may be periodically removed from the core 20 and turned over, thereby increasing its service life. In some particular instances, the leaf spring 22 is fabricated from a spring steel such as a stainless steel spring steel. However, it is to be understood that other resilient materials may be utilized. FIG. 6 depicts a top plan view of one specific configuration of leaf spring which may be employed to fabricate the roller. In this instance, the spring material is 0.030 inch thick spring steel.

Referring back to FIG. 4, it will be seen that the leaf spring members 22 are affixed to the core 20 by screws 24. The screws are disposed proximate the ends of each of the leaf springs. By so positioning the screws, a central portion of the roller is free to receive and retain a web of material thereupon. In order to accommodate possible differential thermal expansion of the springs and core, the springs may be attached to the core so as to permit relative motion thereto. For example, the springs may include slots which receive the screws. And, the springs may be affixed to the core by shoulder screws having a shoulder which is slightly smaller than the opening in the spring and slightly thicker than the thickness of the spring. In this manner, the screw may be tightly seated onto the core, and the shoulder will "stand off" the remainder of the screw head so as to provide clearance that will accommodate movement of the spring. Other such arrangements will be apparent to those of skill in the art. Various other methods of affixation may also be employed. For example, the spring strips may be welded or brazed onto the core, and such affixation may be along the entire length of the spring, or at one or more selected locations, such as the ends.

Figure 7:
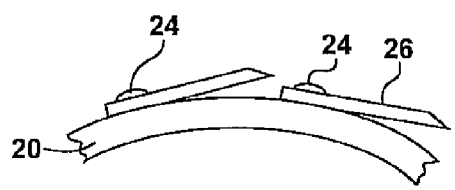
FIG. 7 is an end view of a portion of another embodiment of roller in accord with the present invention.
Figure 8:
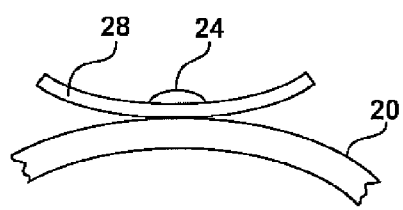
FIG. 8 is an end view of a portion of yet another embodiment of roller in accord with the present invention.

Various other configurations of core and leaf spring may also be implemented to fabricate the roller. For example, FIG. 7 shows a portion of another configuration of roller which includes a core 20 as previously described having leaf spring members 26 affixed to the core 20 by screws 24. However, the roller of the FIG. 7 embodiment includes leaf springs 26 which are affixed proximate one edge thereof so that the other edge is spaced from the core 20. In FIG. 7, only one side of the springs 26 has a tapered edge; however, two-sided, dual tapers as shown in FIG. 5 may also be used in this embodiment. FIG. 8 shows yet another embodiment in which a curved leaf spring 28 having generally rounded edges is affixed to a core 20. Yet other embodiments will be apparent to those of skill in the art.

Figure 9:
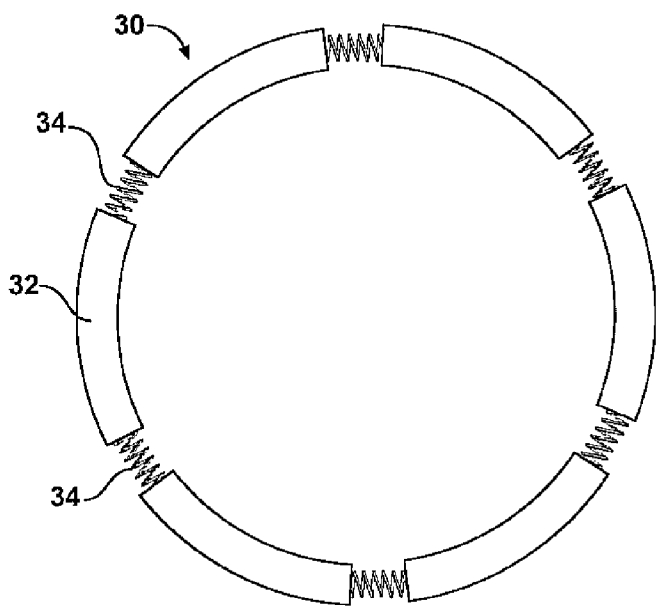
FIG. 9 is an end view of a further embodiment of a roller of the present invention having a radially displaceable outer surface.

Still other configurations of roller having a displaceable surface may be utilized in the practice of the present invention. For example, FIG. 9 shows a roller 30 which is comprised of a plurality of segments, for example segment 32, which cooperate to define a generally cylindrical roller surface. These segments are joined to one another by springs 34. The presence of the springs 34 allows for the cylindrical surface of the roller 30 to be compressed and displaced. In variants of the FIG. 9 embodiment, the number of segments 32 may be increased or decreased in number. Also, the springs may be replaced by other biasing members such as elastic bodies, pneumatic or hydraulic devices, or the like. Yet other embodiments of rollers with displaceable surfaces may be utilized to practice the disclosed method. It is notable that the present invention provides for the fabrication of rollers with radially displaceable surfaces from high temperature tolerant materials such as metals or ceramics. In some specific instances, rollers in accord with this invention are fabricated entirely from metals and/or ceramics.

In one specific group of embodiments, substrates for ultra light photovoltaic devices and other such semiconductor devices are prepared by a process wherein a substrate comprised of a polyimide material, such as the material sold under the designation Kapton®, is laminated onto a stainless steel or other ferrous support member. In these embodiments, the polyimide typically has a thickness in the range of 0.5-2 mils, and in one specific instance has a thickness of approximately 1 mil. The polyimide material is provided with a coating of a fluoropolymer based hot melt adhesive having a thickness of approximately 0.2 mils. The support member is a body of 5 mil thick stainless steel, and in particular instances, the stainless steel is coated with a zinc oxide layer of approximately 500 nanometers thickness. This layer will, in the lamination process, be transferred to the polyimide substrate and function to prevent layer curl. In particular instances, a layer of metal such as titanium having a thickness of approximately 50 nanometers is disposed upon the stainless steel, beneath the zinc oxide layer. This titanium layer functions to prevent etching of the zinc oxide when the stainless steel layer is subsequently etched away from the polyimide. As such, it is referred to as an etch-stop layer.

In this process, the stainless steel support and polyimide substrate are wound onto the roller under tension, in an interleaved relationship as depicted in FIG. 2. The wound roll is disposed in a vacuum chamber and maintained at a pressure in the general range of 1-50 millitorr. In a specific instance the chamber is maintained at a pressure of approximately 10 millitorr under a flow of nitrogen. Heating may be accomplished by the use of a conventional vacuum oven; however in one specific embodiment, heating is accomplished by disposing a radiant heater within the core of the roller and disposing a heater blanket about the outside of the rolled material. Other heating arrangements may also be utilized. The roll is raised to a temperature of 350° C. over a period of 24 hours then maintained at 350° C. for another period of 24 hours and subsequently allowed to cool to room temperature over a third 24 hour period. Once the roll has been cooled, the chamber is raised to atmospheric pressure and the roll is removed. It has been found that this produces a high quality lamination devoid of bubbles or other inclusions. The substrate thus produced has a very uniform and level surface and is very suitable for the deposition of high-quality thin film electronic devices thereupon.

It is to be understood that modifications and variations of this process may be implemented. For example, pressure and temperature conditions as well as times may be varied as will be appropriate for particular materials being laminated. In some instances, a low-pressure environment will not be required. In other instances, lamination may be accomplished solely by pressure, and significant external heating need not employed. In some instances, the webs are wound onto the roller under tension, while in other instances the webs may not be under significant initial tension, but will subsequently be tensioned when the roller is heated and expands thereby compressing the surface. Also, as noted above, various configurations of compressible roller may be utilized in the present invention. All of such modifications and variations are within the scope of this invention. The foregoing drawings, discussion and description are illustrative of specific embodiments of the invention, but are not meant to be limitations upon the practice thereof. It is the following claims, including all equivalents, which define the scope of the invention.

The invention claimed is:

1. A method for laminating elongated webs of sheet material, said method comprising the steps of:
   providing a first elongated web of sheet material;
   providing a second elongated web of sheet material;
   providing a roller having a radially displaceable outer surface, said roller comprising: a roller core having a cylindrical outer surface, and a plurality of leaf springs supported upon at least a portion of the outer surface of said roller core; wherein each of said leaf springs is an elongated spring having a length dimension which is greater than a width dimension, and wherein each of said leaf springs is disposed upon said cylindrical surface with its length dimension aligned with the length dimension of said cylindrical surface and its width dimension aligned with the circumference of said cylindrical surface so that said width dimension defines a line which is tangent to the cylindrical surface of said roller core; wherein a first portion of each of each of said leaf springs is affixed to said surface, so that in the absence of an external bias, a second portion of each of said leaf springs is spaced from said surface and is capable of being biased towards said surface by the application of an external biasing force thereupon;
   rolling said first and said second webs onto said roller in an interleaved relationship; and
   heating the roller having said webs rolled thereupon.

2. The method of claim 1, wherein the first and second webs are rolled onto said roller so as to compress the radially displaceable surface of the roller, whereby the radially displaceable surface exerts an outward bias on the first and second webs rolled thereupon.

3. The method of claim 1, wherein said first and second webs are rolled onto said roller so as to not initially compress the radially displaceable surface of the roller;

whereby when said roller is heated, said roller expands thereby causing the radially compressible surface thereof to exert an outward bias on the first and second webs rolled thereupon.

4. The method of claim 1, wherein at least one of said first and second elongated webs has an adhesive material disposed upon a surface thereof, and said webs are disposed upon said roller so that said adhesive is interposed between said webs.

5. The method of claim 4, wherein said adhesive is a hot melt adhesive.

6. The method of claim 1, including the further steps of providing a body of adhesive material and rolling said body of adhesive material onto said roller in an interleaved relationship between said first web and said second web.

7. The method of claim 1, including the further step of maintaining said first and second webs at a subatmospheric pressure during at least a portion of the time they are disposed upon said roller.

8. The method of claim 7, wherein said subatmospheric pressure is in the range of 1-50 mtorr.

9. The method of claim 1, wherein at least one of said webs is comprised of a polymeric material.

10. The method of claim 1, wherein at least one of said webs is comprised of a metal.

11. The method of claim 1, wherein at least one of said webs has at least one layer of an inorganic material disposed thereupon.

12. The method of claim 11, wherein said at least one layer of inorganic material includes at least one of: a layer of zinc oxide and a layer of titanium.

* * * * *